(12) United States Patent
Lee et al.

(10) Patent No.: US 7,243,708 B2
(45) Date of Patent: Jul. 17, 2007

(54) RADIATOR WITH STREAMLINE AIRFLOW GUIDING STRUCTURE

(75) Inventors: Hsieh Kun Lee, Tu-Chen (TW); Chun-Chi Chen, Tu-Chen (TW); Yi Qiang Wu, Shenzhen (CN)

(73) Assignees: Fu Zhun Precision Industry (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 76 days.

(21) Appl. No.: 10/945,624

(22) Filed: Sep. 20, 2004

(65) Prior Publication Data

US 2005/0061479 A1 Mar. 24, 2005

(30) Foreign Application Priority Data

Sep. 19, 2003 (TW) .............................. 92216905 U

(51) Int. Cl.
F28D 15/00 (2006.01)
H05K 7/20 (2006.01)

(52) U.S. Cl. ................................. 165/104.33; 165/80.3

(58) Field of Classification Search ................ 165/185, 165/80.3, 104.21, 104.26, 104.33, 104.34, 165/121; 361/697, 700, 702, 704; 257/714, 257/715; 174/15.2, 16.3
See application file for complete search history.

(56) References Cited

U.S. PATENT DOCUMENTS

| | | | |
|---|---|---|---|
| 4,823,869 A | 4/1989 | Arnold et al. | |
| 5,901,040 A * | 5/1999 | Cromwell et al. | 361/704 |
| 6,189,601 B1 * | 2/2001 | Goodman et al. | 165/80.3 |
| 6,382,306 B1 | 5/2002 | Hsu | |
| 6,394,175 B1 | 5/2002 | Chen et al. | |
| 6,625,021 B1 * | 9/2003 | Lofland et al. | 361/697 |
| 6,741,468 B2 * | 5/2004 | Jing et al. | 361/700 |
| 6,779,595 B1 * | 8/2004 | Chiang | 165/104.33 |
| 2003/0141041 A1 * | 7/2003 | Chen | 165/80.3 |
| 2003/0209342 A1 * | 11/2003 | Hsin et al. | 165/80.3 |
| 2004/0074633 A1 * | 4/2004 | Liu | 165/80.3 |
| 2006/0011329 A1 * | 1/2006 | Wang et al. | 165/104.33 |

FOREIGN PATENT DOCUMENTS

| | | |
|---|---|---|
| CN | 2550536 Y | 5/2003 |
| TW | 482313 | 4/2002 |

* cited by examiner

Primary Examiner—Tho Duong
(74) Attorney, Agent, or Firm—Wei Te Chung

(57) ABSTRACT

A radiator includes a flat base (10), a pair of heat pipes (20) and a plurality of fins (30) on the base. The base defines a pair of grooves (12) through a top portion thereof. Each heat pipe includes parallel and symmetrical first and second sections (22, 24). The first sections are soldered to the base in the grooves. Each fin defines a notch (32) at a bottom portion thereof and a pair of holes (36) at opposite sides of the notch. Flanges (35) extend perpendicularly from the notches of the fins, cooperatively defining a streamline airflow guiding surface. Collars (37) extend perpendicularly from the holes of the fins, for receiving the second sections of the heat pipes.

13 Claims, 6 Drawing Sheets

RADIATOR WITH STREAMLINE AIRFLOW GUIDING STRUCTURE

BACKGROUND OF THE INVENTION

1. Field of the Invention

The present invention relates to radiators for removing heat from electronic components, and more particularly to a radiator having a streamline airflow guiding structure.

2. Description of Related Art

During operating of an electronic component such as a computer central processing unit (CPU), a large amount of heat is often produced. The heat must be quickly removed from the CPU to prevent it from becoming unstable or being damaged. Typically, a heat sink is attached to an outer surface of the CPU to facilitate removal of heat therefrom. A fan is mounted on top of the heat sink to enhance heat dissipation efficiency.

FIG. 9 shows a radiator having a heat sink and a fan mounted on the heat sink. The radiator comprises a flat base 100 for contacting a surface of an electronic component, a plurality of fins 200 extending perpendicularly from the base 100 for radiating heat to the air, and a fan 300 mounted on the fins 200 for providing enforced air convection within channels defined between the fins 200. Since the base 100 is flat, the air that is directed to the base 100 partly returns back after hitting the base 100. The returning air impinges with the fresh air directed to the base 100 subsequently from the fan 300 and holds the fresh air from exchanging heat with the fins 200 adjacent the base 100. Thus, the radiator is inefficient for radiating heat due to the impingement of airflow.

SUMMARY OF THE INVENTION

Accordingly, an object of the present invention is to provide a radiator having improved airflow path for efficient heat radiating.

In order to achieve the object set out above, a radiator in accordance with a preferred embodiment of the present invention comprises a flat base, a pair of heat pipes and a plurality of fins on the base. The base defines a pair of grooves through a top portion thereof. Each heat pipe comprises parallel and symmetrical first and second sections. The first sections are soldered to the base in the grooves. Each fin defines a notch at a bottom portion thereof and a pair of holes at opposite sides of the notch. Flanges extend perpendicularly from the notches of the fins, cooperatively defining an airflow guiding surface. Collars extend perpendicularly from the holes of the fins, for receiving the second sections of the heat pipes Other objects, advantages and novel features of the present invention will become more apparent from the following detailed description when taken in conjunction with the accompanying drawings, in which:

DETAILED DESCRIPTION OF THE INVENTION

Figure 1:
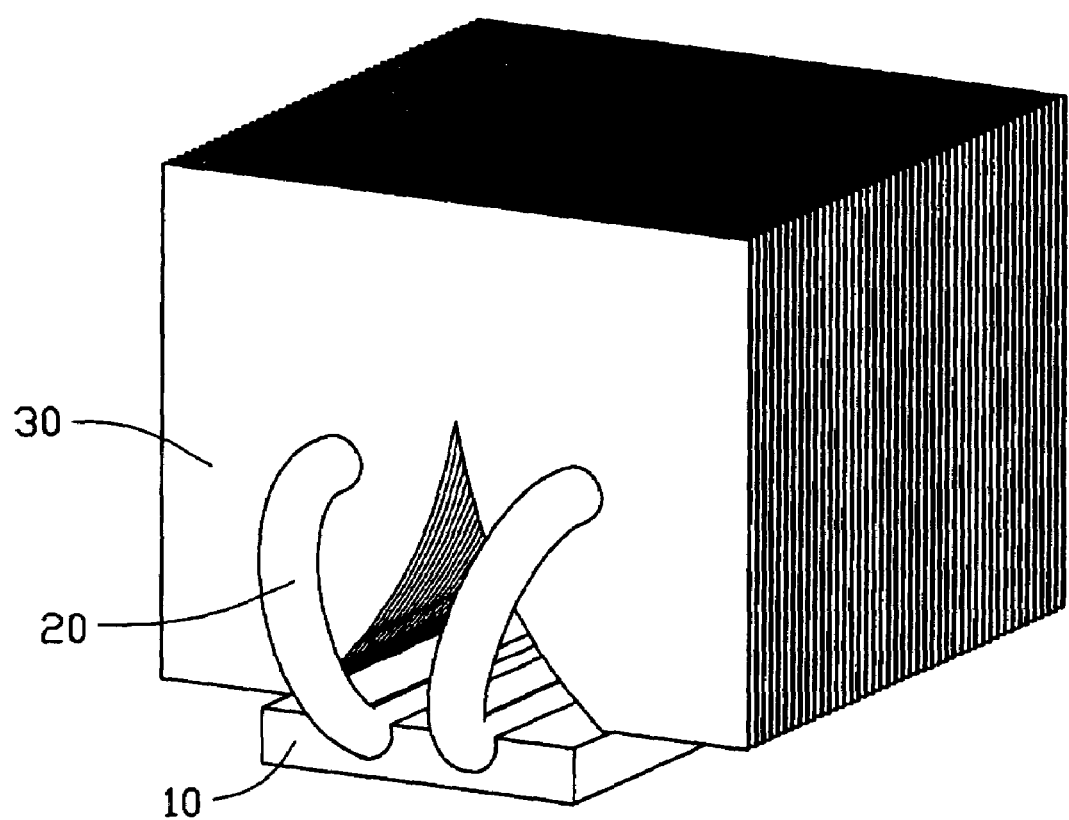
FIG. 1 is an isometric view of a radiator in accordance with the preferred embodiment of the present invention.
Figure 2:
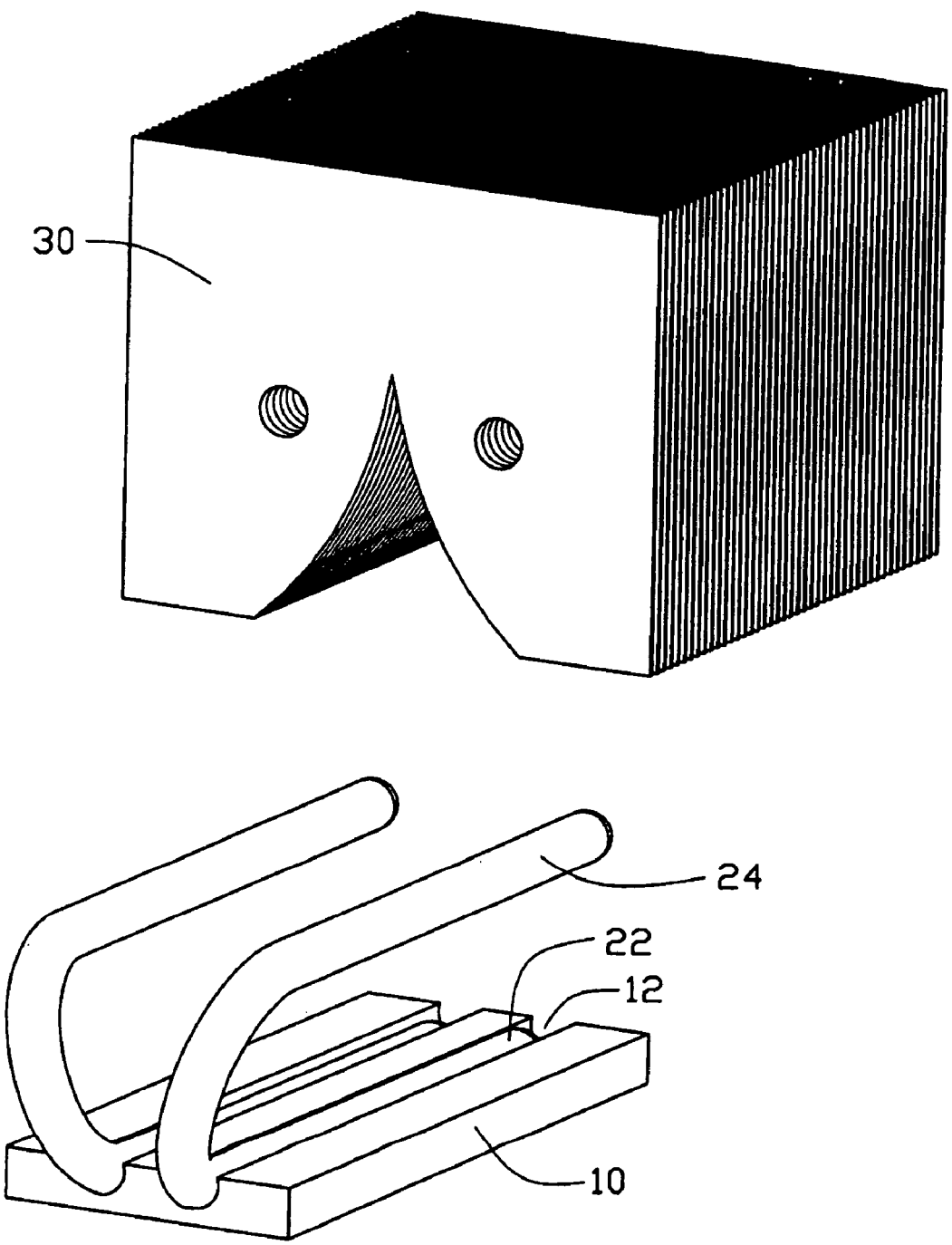
FIG. 2 is an exploded, isometric view of the radiator of FIG. 1.

Referring to FIGS. 1–4, a radiator in accordance with the preferred embodiment of the present invention comprises a flat base 10 for contacting an electronic component, a pair of heat pipes 20 and a plurality of fins 30. A fan 40 can be mounted on the fins 30 for facilitating air convection.

The base 10 defines a pair of parallel grooves 12 through a top portion thereof. Each heat pipe 20 is substantially U-shaped, comprises parallel and symmetrical first and second sections 22, 24. The first sections 22 are lodged within the grooves 12 and soldered to the base 10.

The fins 30 are attached on the base 10 and parallelly arranged at uniform intervals. Each fin 30 has a substantially rectangular configuration. A tapered notch 32 is defined in a bottom portion of each fin 30 toward the base 10. The notch 32 has an upmost point 33 distal from the base 10. A pair of flanges 35 extends perpendicularly from the notch 32 and encounters one another at the upmost point 33 of the notch 32. A pair of holes 36 is defined in each fin 30 at opposite sides of the notch 32, for receiving the second sections 24 of the heat pipes 20. A collar 37 extends perpendicularly from each hole 36, for increasing engaging area with the heat pipes 20. All of the fins 30 are identically configured as described above. The intervals between adjacent fins 30 are determined by either the flanges 35 or the collars 37. As a result, channels (not labeled) are defined between the fins 30. The flanges 35 define a pair of symmetrical continuous cambered surfaces, and the collars 37 define a continuous passage for engaging with the second sections 24 of the heat pipes.

Figure 3:
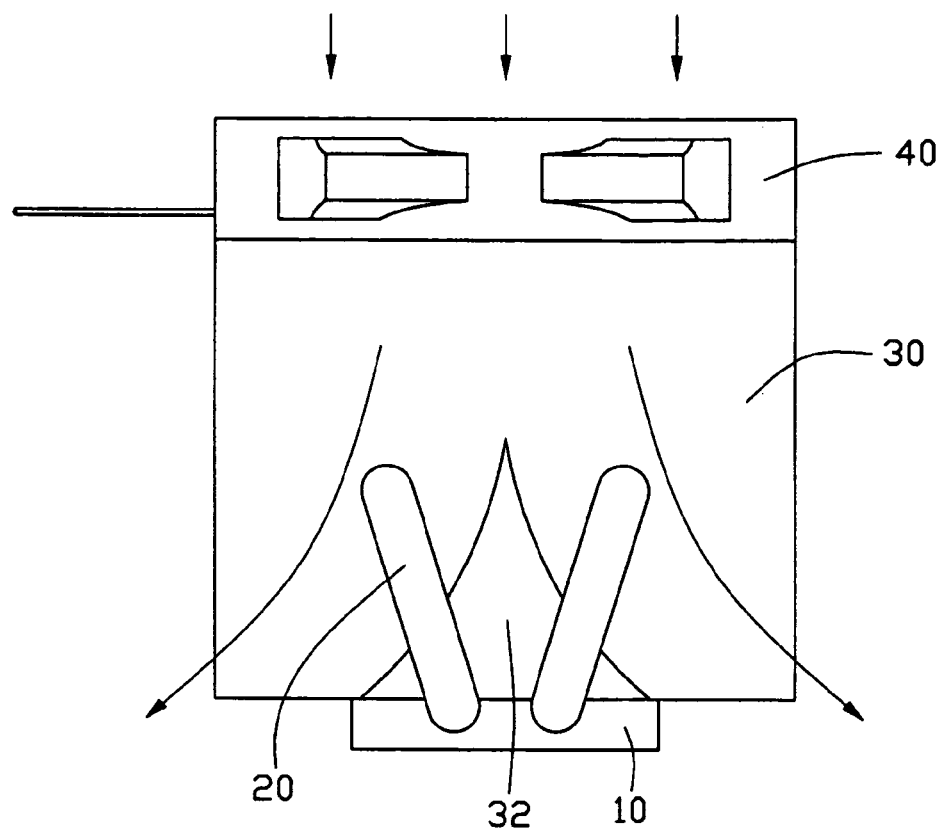
FIG. 3 is a side elevation of the radiator of FIG. 1, showing airflow directions when a fan is mounted on the radiator.
Figure 4:
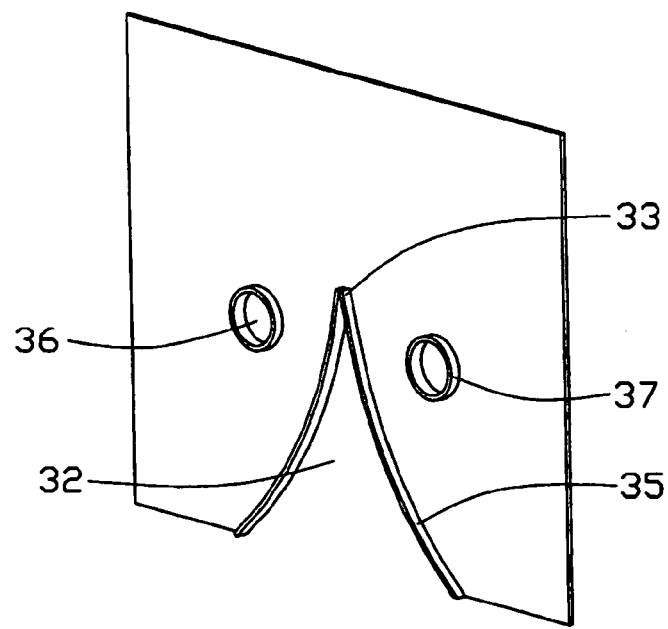
FIG. 4 is a rear view of a fin of the radiator of FIG. 1.
Figure 5:
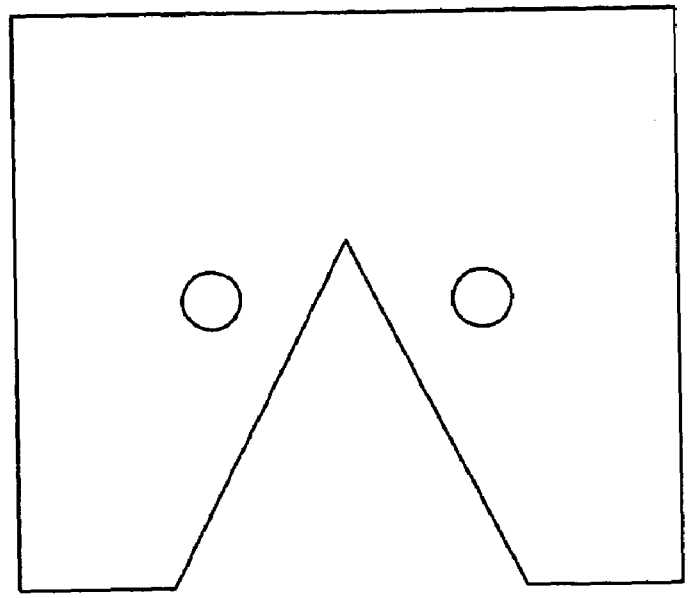
FIGS. 5–8 are front elevations of fins of alternative embodiments of the present invention.
Figure 6:
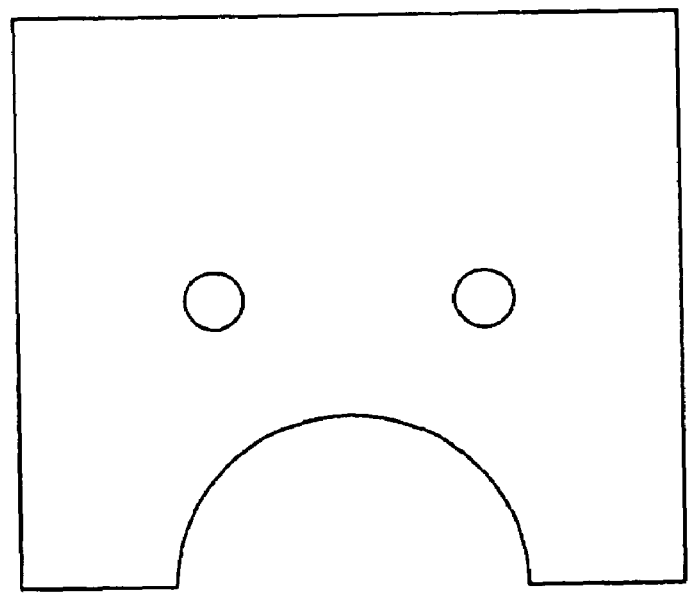
Figure 7:
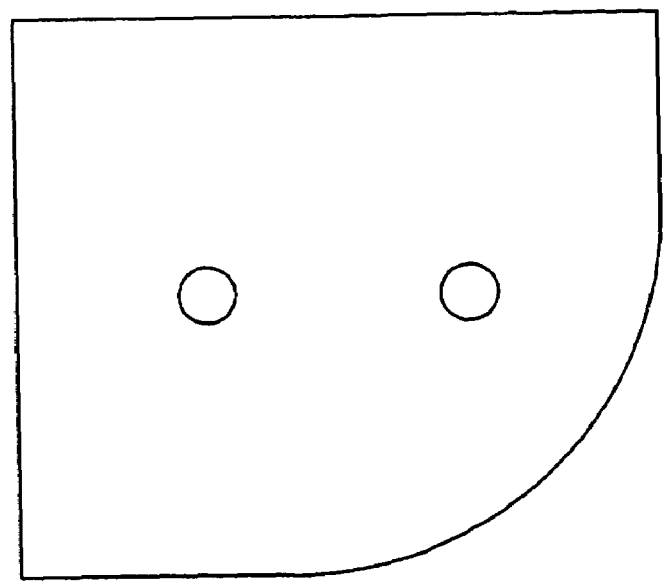
Figure 8:
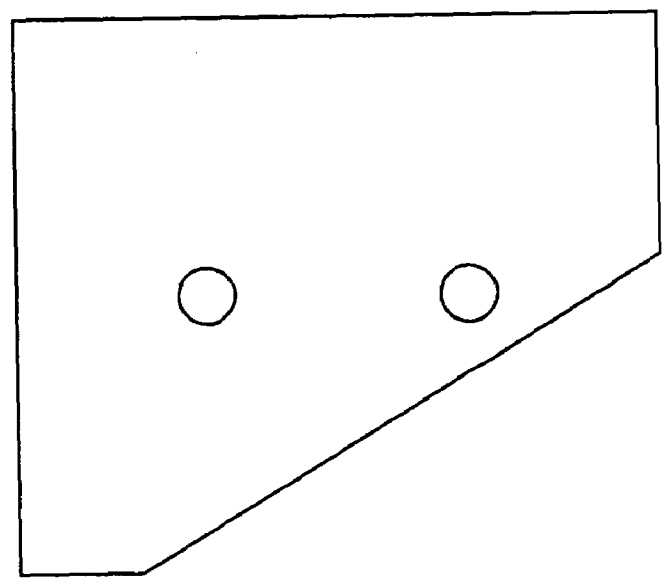
Figure 9:
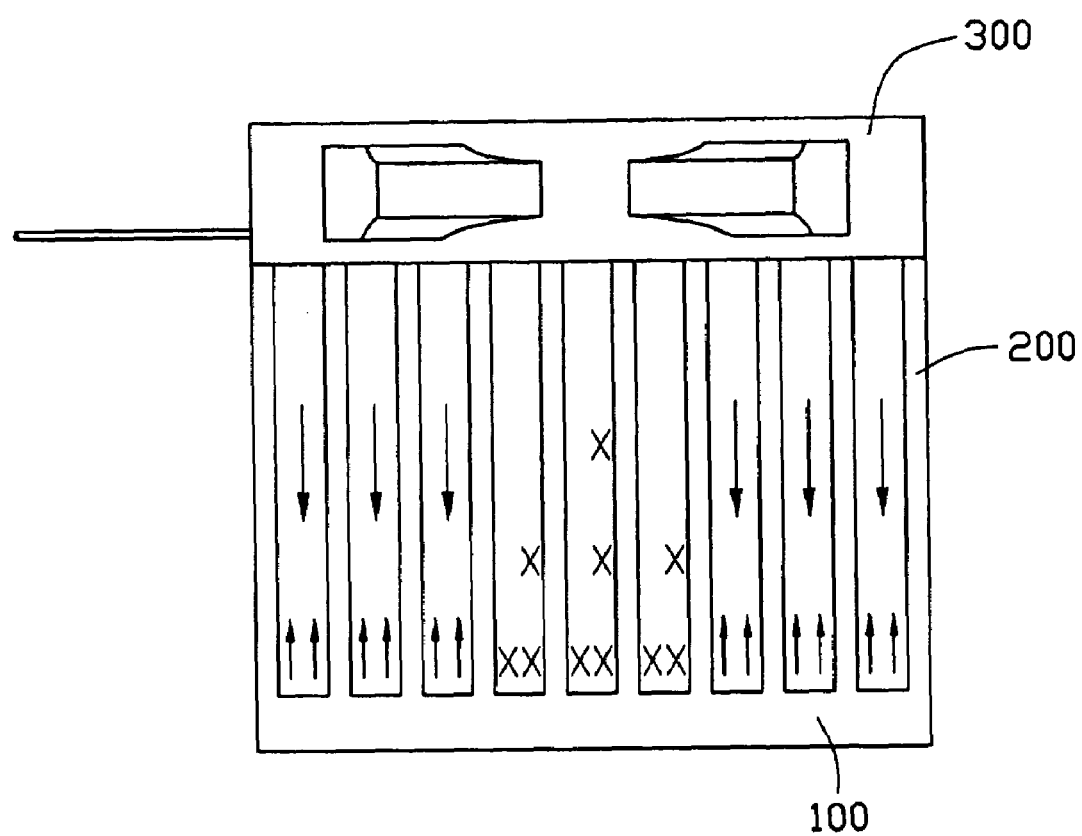
FIG. 9 is a side elevation of a conventional radiator having a fan mounted thereon.

When the fan 40 mounted on the fins 30 operates, cooling air from the fan 40 flows through said channels between the fins and travels along the cambered surfaces defined by the flanges 37 to surrounding space, as shown in FIG. 3. The air thereby fluently flows in the radiator.

In the invention, it is the heat pipes 20 primarily that transfer the heat accumulated on the base 10 to the fins 30.

It is to be understood, however, that even though numerous characteristics and advantages of the present invention have been set forth in the foregoing description, together with details of the structure and function of the invention, the disclosure is illustrative only, and changes may be made in detail, for example, fins 30 of the radiator shaped like that shown in FIGS. 5–8 can also form an airflow guiding structure having a substantially same result as set forth in the preferred embodiment.

What is claimed is:

1. A radiator comprising:
   a flat base;
   a fin assembly having a top portion adapted for mounting a fan thereon, and a bottom portion mounted on the base, an airflow guiding surface defined from the bottom portion toward the top portion, the airflow guiding surface having a peak distant from the bottom portion and two parts extending from the peak toward two opposite sides of the bottom portion in a slant manner, respectively, whereby an airflow generated by the fan flows along the two parts of the airflow guiding surface via the peak thereof toward the two opposite sides of the bottom portion; and a heat pipe comprising a first section lodged in the base and an opposite second section extending through the fin assembly.

2. The radiator of claim 1, wherein the base defines a groove through a top portion thereof for receiving the first section of the heat pipe.

3. The radiator of claim 1, wherein the first section is soldered to the base.

4. The radiator of claim 1, wherein the fin assembly comprises a plurality of fins parallel to each other at uniform intervals.

5. The radiator of claim 4, wherein each of the tins defines a notch at a bottom portion.

6. The radiator of claim 5, wherein each of the fins forms a flange extending perpendicularly from an edge of the notch, the flanges cooperatively defining the airflow guiding surface.

7. The radiator of claim 6, wherein the intervals between the fins are determined by the flanges of the fins.

8. The radiator of claim 4, wherein each of the fins defines a hole therein and forms a collar extending perpendicularly from the hole, and the second section of the heat pipe is engagingly received in the holes and the collars.

9. The radiator of claim 8, wherein the intervals between the fins are determined by the collars of the fins.

10. The radiator of claim 1, wherein the first and second sections of the heat pipe are parallel and symmetrical to one another.

11. A radiator comprising:
a base defining a flat bottom surface adapted to contact a heat generating device, a fan being located adjacent to said fin assembly; and
a fin assembly positioned on the base, including a plurality of parallel spaced fins, each of said fins being equipped with a flange defining an airflow guiding surface toward the base, wherein
each of said fins defines a space under said flange and above said base for ventilation in a direction perpendicular to said fins, an airflow driven by said fan not entering said space due to said flange;
wherein a notch is defined in the each fin facing the base, and the flange is formed along a border of the notch so as to define the airflow guiding surface; and
wherein the airflow guiding surface comprises a pair of continuous cambered surfaces encountering with each other at their uppermost points.

12. The radiator of claim 11, wherein a heat pipe extends along and between said base and said fin for increasing heat transfer between the base and the fin assembly under a condition that a portion of said heat pipe is exposed to said space.

13. The radiator of claim 11, wherein said space communicates with an exterior in said direction perpendicular to said fins.

* * * * *